(12) United States Patent
Citla et al.

(10) Patent No.: US 11,972,943 B2
(45) Date of Patent: Apr. 30, 2024

(54) METHODS AND APPARATUS FOR DEPOSITING DIELECTRIC MATERIAL

(71) Applicant: APPLIED MATERIALS, INC., Santa Clara, CA (US)

(72) Inventors: Bhargav S. Citla, Fremont, CA (US); Jethro Tannos, San Jose, CA (US); Srinivas D Nemani, Sunnyvale, CA (US); Joshua Rubnitz, Monte Sereno, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 87 days.

(21) Appl. No.: 16/578,050

(22) Filed: Sep. 20, 2019

(65) Prior Publication Data
US 2021/0090883 A1 Mar. 25, 2021

(51) Int. Cl.
*H01L 21/02* (2006.01)
*C23C 16/455* (2006.01)
*H01J 37/32* (2006.01)

(52) U.S. Cl.
CPC .. *H01L 21/02274* (2013.01); *C23C 16/45536* (2013.01); *H01J 37/321* (2013.01); *H01L 21/02164* (2013.01)

(58) Field of Classification Search
CPC ......... H01L 21/02274; H01L 21/02164; H01L 21/67184; H01L 21/0228; H01J 37/321; C23C 16/45536
See application file for complete search history.

(56) References Cited

U.S. PATENT DOCUMENTS 5,723,386 A 3/1998 Ishikawa
6,106,678 A 8/2000 Shufflebotham et al.
(Continued)

FOREIGN PATENT DOCUMENTS

WO WO 2015/105673 7/2015

OTHER PUBLICATIONS

Ristic ("Dependence of Static Dielectric Constant on Resistivity at Room Temperature", Ristic et al, Serbian Journal of Electrical Engineering, vol. 1, No. 2, Jun. 2004, 237-247) (Year: 2004).*

(Continued)

*Primary Examiner* — Michael G Miller
(74) *Attorney, Agent, or Firm* — MOSER TABOA

(57) ABSTRACT

Methods and apparatus for depositing a dielectric material include: providing a first gas mixture into a processing chamber having a substrate disposed therein; forming a first remote plasma comprising first radicals in a remote plasma source and delivering the first radicals to an interior processing region in the processing chamber to form a layer of dielectric material in an opening in a material layer disposed on the substrate in a presence of the first gas mixture and the first radicals; terminating the first remote plasma and applying a first RF bias power to the processing chamber to form a first bias plasma; contacting the layer of dielectric material with the first bias plasma to form a first treated layer of dielectric material; and subsequently forming a second remote plasma comprising second radicals in the remote plasma source and delivering the second radicals to the interior processing region in the processing chamber in a presence of a second gas mixture while applying a second RF bias power to the processing chamber to form a second bias plasma, wherein the second radicals and second bias plasma contact the first treated layer of dielectric material to (Continued)

increase a hydrophobicity or a viscosity of the first treated layer of dielectric material.

20 Claims, 5 Drawing Sheets

(56) References Cited

U.S. PATENT DOCUMENTS

| | | | |
|---|---|---|---|
| 6,413,583 | B1 | 7/2002 | Moghadam et al. |
| 9,177,796 | B2 | 11/2015 | Bencher et al. |
| 9,640,384 | B2 | 5/2017 | Ishibashi |
| 10,096,466 | B2 | 10/2018 | Xue et al. |
| 2004/0048485 | A1 | 3/2004 | Min et al. |
| 2005/0271809 | A1* | 12/2005 | Kobrin ............... C23C 16/402 |
| | | | 427/248.1 |
| 2006/0003603 | A1 | 1/2006 | Fukuchi |
| 2006/0057855 | A1* | 3/2006 | Ramos ............ H01L 21/02216 |
| | | | 438/710 |
| 2008/0026597 | A1 | 1/2008 | Munro et al. |
| 2011/0223765 | A1* | 9/2011 | Rajagopalan ..... C23C 16/45523 |
| | | | 438/791 |
| 2014/0213070 | A1 | 7/2014 | Hong et al. |
| 2015/0221479 | A1 | 8/2015 | Chen et al. |
| 2016/0194758 | A1* | 7/2016 | Nemani ............... C23C 16/401 |
| | | | 427/527 |
| 2016/0276150 | A1* | 9/2016 | Xue .................. H01L 21/02216 |
| | | | 438/710 |
| 2017/0125217 | A1 | 5/2017 | Dorf et al. |
| 2018/0051368 | A1 | 2/2018 | Liu et al. |
| 2018/0209037 | A1 | 7/2018 | Citla et al. |
| 2018/0330980 | A1 | 11/2018 | Liang et al. |
| 2019/0035605 | A1 | 1/2019 | Suzuki |
| 2019/0217842 | A1 | 7/2019 | Leinung et al. |

OTHER PUBLICATIONS

Usenko ("Silicon Nitride Surface Conversion into Oxide to Enable Hydrophilic Bonding", Usenko et al, ECS Transactions, 33 (4) 475-483 (2010)) (Year: 2010).*
International Search Report and Written Opinion for PCT/US2020/051719 dated Jan. 4, 2021.
Supplementary European Search Report for EP 20 86 5762 dated Sep. 27, 2023.
Christoph Vallee et al., "Plasma deposition—Impact of ions in plasma enhanced chemical vapor deposition, plasma enhanced atomic layer deposition, and applications to area selective deposition", Journal of Vacuum Science, American Institute of Physics, vol. 8, No. 3, Apr. 17, 2020, 15 pages.

* cited by examiner

500

| FILLING AN OPENING HAVING AN ASPECT RATIO GREATER THAN 5 ON A SUBSTRATE WITH A DIELECTRIC MATERIAL FORMED FROM SEQUENTIALLY APPLYING A FIRST REMOTE PLASMA, A FIRST BIAS PLASMA, AND A SECOND REMOTE PLASMA IN COMBINATION WITH A SECOND BIAS PLASMA TO AN INTERIOR PROCESSING REGION OF A PROCESSING CHAMBER WHERE THE SUBSTRATE IS DISPOSED | — 502 |

↓

| INCREASING AT LEAST A FLOWABILITY OR A HYDROPHOBICITY OF THE DIELECTRIC MATERIAL | — 504 |

FIG. 5

METHODS AND APPARATUS FOR DEPOSITING DIELECTRIC MATERIAL

FIELD

Embodiments of the present disclosure generally relate to methods and apparatus for depositing a dielectric material and altering the hydrophobicity thereof.

BACKGROUND

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. As the width of features such as trenches continues to shrink, the aspect ratio (depth divided by width) continues to grow for the stacking of the semiconductor chips. One challenge regarding the manufacture of high aspect ratio features such as trenches is avoiding the formation of voids or seams during the deposition of dielectric material in the trenches.

To fill a trench, a layer of dielectric material, such as silicon oxide, is deposited. The dielectric layer typically covers the field, as well as the walls and the bottom of the feature such as a trench. If the feature is wide and shallow, completely filling the feature is not difficult. However, as the feature aspect ratio increases, the likelihood that the opening of the trench will "pinch off", forming a void or defects within the feature increases. The inventors have observed voids or seams may reduce yield of semiconductor products and alter the dielectric constant of a dielectric material should subsequently deposited metal fill a void or seam therein.

To decrease the likelihood of forming a void or defect within the feature such as forming seams within the trench, many different process techniques have been developed to fill in the feature with the dielectric materials with minimum defects. Poor process control during the deposition process will result in irregular structure profiles or early closure of the feature such as a trench, resulting in voids or air gap in the trench while filling the trench with the dielectric materials.

Flowable chemical vapor deposition (FCVD) is one method for filling a feature such as a trench from the bottom up avoiding void or defect formation. However the inventors have observed dielectric material formed from FCVD methods may be unstable and may not improve the overall stability and quality of a dialectic film resulting in increased device resistance and poor yield. For example, the inventors have observed that a bias plasma treatment may be employed to densify a deposited flowable film material, however methods may problematically lower the flowability of the film formed therefrom leading to conformal deposits and problematic void or seam formation. The inventors have also observed bias plasma treatment of a flowable film material may decrease the hydrophobicity of the deposited flowable film.

Accordingly, the inventors have provided improved methods and apparatus suitable for improving material formed from FCVD methods.

SUMMARY

Methods and apparatus for depositing dielectric materials are provided herein. In some embodiments, a method of depositing a dielectric material includes: (a) providing a first gas mixture into a processing chamber having a substrate disposed therein; (b) forming a first remote plasma comprising first radicals in a remote plasma source and delivering the first radicals to an interior processing region in the processing chamber to form a layer of dielectric material in an opening in a material layer disposed on the substrate in a presence of the first gas mixture and the first radicals; (c) terminating the first remote plasma and applying a first RF bias power to the processing chamber to form a first bias plasma; (d) contacting the layer of dielectric material with the first bias plasma to form a first treated layer of dielectric material; and (e) subsequently forming a second remote plasma comprising second radicals in the remote plasma source and delivering the second radicals to the interior processing region in the processing chamber in a presence of a second gas mixture while applying a second RF bias power to the processing chamber to form a second bias plasma, wherein the second radicals and second bias plasma contact the first treated layer of dielectric material to increase a hydrophobicity or a viscosity of the first treated layer of dielectric material.

In some embodiments, a method for forming a dielectric material includes: filling an opening having an aspect ratio greater 5 on a substrate with a dielectric material formed from sequentially applying a first remote plasma, a first bias plasma, and a second remote plasma in combination with a second bias plasma to an interior processing region of a processing chamber where the substrate is disposed; and increasing at least a flowability or a hydrophobicity of the dielectric material.

In some embodiments, the present disclosure relates to a non-transitory computer readable storage medium having stored instructions thereon that, when executed by a processor, cause a method to be performed, the method including: (a) providing a first gas mixture into a processing chamber having a substrate disposed therein; (b) forming a first remote plasma comprising first radicals in a remote plasma source and delivering the first radicals to an interior processing region in the processing chamber to form a layer of dielectric material in an opening in a material layer disposed on the substrate in a presence of the first gas mixture and the first radicals; (c) terminating the first remote plasma and applying a first RF bias power to the processing chamber to form a first bias plasma; (d) contacting the layer of dielectric material with the first bias plasma to form a first treated layer of dielectric material; and (e) subsequently forming a second remote plasma comprising second radicals in the remote plasma source and delivering the second radicals to the interior processing region in the processing chamber in a presence of a second gas mixture while applying a second RF bias power to the processing chamber to form a second bias plasma, wherein the second radicals and second bias plasma contact the first treated layer of dielectric material to increase a hydrophobicity or a viscosity of the first treated layer of dielectric material.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 5 is a process flow diagram illustrating another method for forming a dielectric material of the present disclosure.

Figure 1:
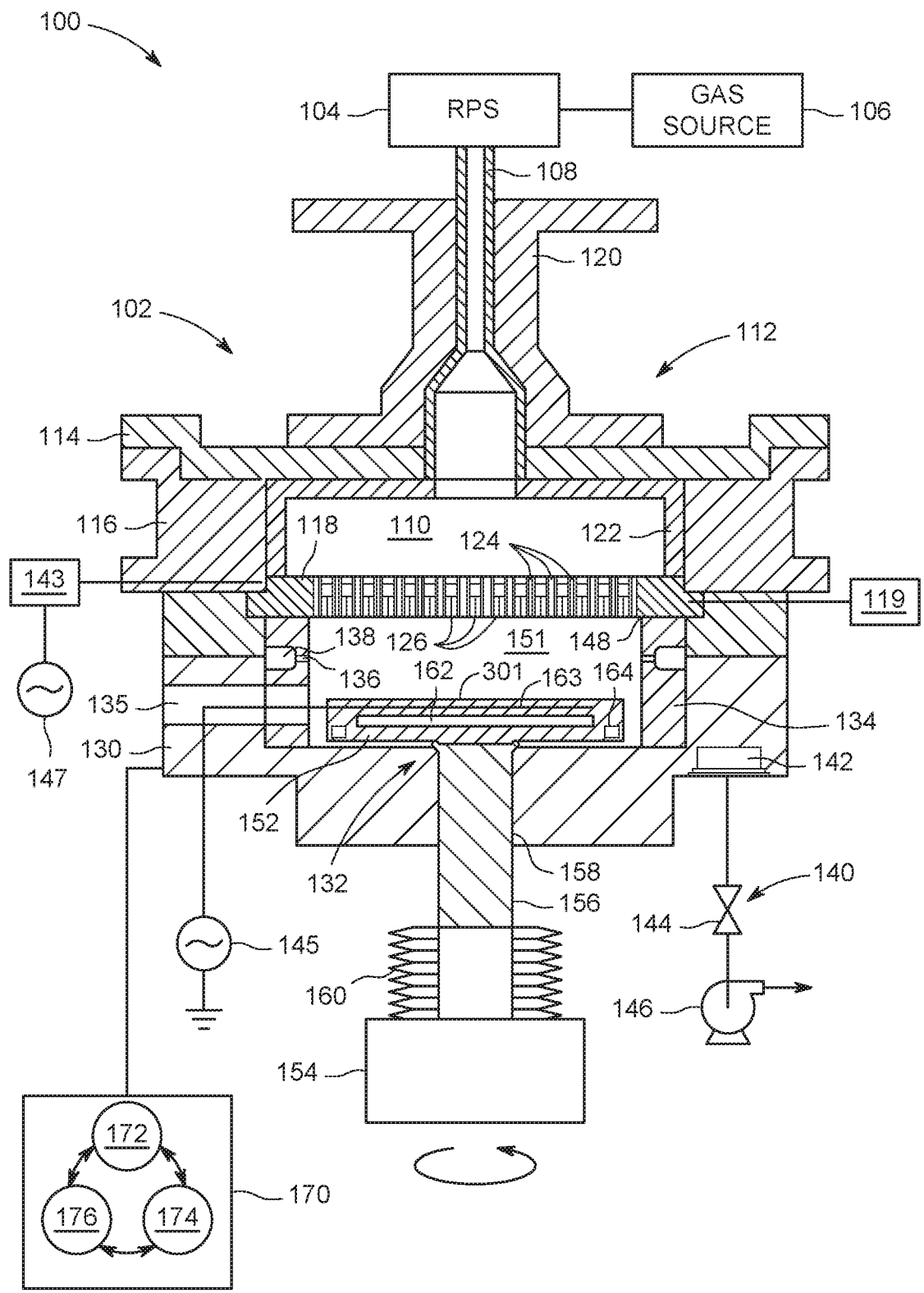
FIG. 1 depicts a schematic, cross-sectional side view an apparatus for performing a deposition process in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The present disclosure relates to apparatuses and methods for depositing a dielectric material in one or more features such as a trench with a high aspect ratio for semiconductor devices, particularly for three dimensional (3D) stacking of semiconductor chips. In some embodiments, a deposition process may sequentially use remote plasma, RF bias power, and a combination of remote plasma and RF bias power supplied to a substrate support assembly on which the substrate is placed to treat the deposited material and maintain or increase the flowability of the material and/or hydrophobicity of the material to advantageously reduce or eliminate void or seam formation. In some embodiments, a remote plasma, a RF bias power, and a combination of remote plasma and a RF bias power is sequentially and cyclically supplied to an interior processing region of the processing chamber to provide a good gap-filling capability for the dielectric material filling in the features such as a trench from the substrate. In some embodiments the dielectric material is treated with a first remote plasma, a first RF bias power, and a combination of a second remote plasma and a second RF bias power to modify one or more characteristics of the dielectric material such as density, flowability, and/or hydrophobicity. In some embodiments, maintaining or increasing the dielectric layer material hydrophobicity such that the dielectric material has a contact angle between 90 degrees and 110 degrees when contacted with water maintains the flowability of the dielectric material improving gap fill from the bottom up advantageously increasing device yield and maintaining the dielectric constant of the deposited material.

Accordingly, the present disclosure includes depositing a dielectric material into a feature such as a trench or via for semiconductor devices, particularly for three dimensional (3D) stacking of semiconductor chips to provide a good gap-filling capability for the dielectric material filling of the feature. FIG. 1 is a cross-sectional view of a deposition processing chamber 100 for performing a deposition process that can deposit a dielectric material for semiconductor applications in accordance with the present disclosure. Non-limiting suitable processing chambers that may be adapted for use herein include, for example, an HDP-PRODUCER® or C3® processing chamber available from Applied Materials, Inc. of Santa Clara, CA Other process chambers, including chambers available from other manufacturers, may also be suitably used in connection with the teachings provided herein.

Referring to FIG. 1, the processing chamber 100 includes a processing chamber body 102 and a remote plasma source 104 coupled to the processing chamber body 102. The remote plasma source 104 may be any suitable source that is capable of generating radicals. The remote plasma source 104 may be a remote plasma source, such as a radio frequency (RF) or very high radio frequency (VHRF) capacitively coupled plasma (CCP) source, an inductively coupled plasma (ICP) source, a microwave induced (MW) plasma source, an electron cyclotron resonance (ECR) chamber, or a high density plasma (HDP) chamber. In some embodiments, the remote plasma source 104 may include one or more gas sources 106 and the remote plasma source 104 may be coupled to the processing chamber 100 by a radical conduit 108. One or more process gases, which may be radical-forming gases, may enter the remote plasma source 104 via the one or more gas sources 106. The one or more process gases may include a chlorine-containing gas, fluorine containing gas, inert gas, oxygen-containing gas, a nitrogen-containing gas, a hydrogen containing gas, or any combination thereof. In some embodiments, the process gasses include plasma gas selected from ammonia ($NH_3$), nitrogen ($N_2$), hydrogen ($H_2$), and combinations thereof. Radicals generated in the remote plasma source 104 travel into the processing chamber 100 through the radical conduit 108 coupling to the processing chamber 100, reaching an interior processing region 151 defined in the processing chamber 100.

In some embodiments, the radical conduit 108 is a part of a lid assembly 112, which also includes a radical cavity 110, a top plate 114, a lid rim 116, and a showerhead 118. The radical conduit 108 may include a material that is substantially nonreactive to radicals. For example, radical conduit 108 may include aluminum nitride (AlN), silicon oxide ($SiO_2$), yttrium oxide ($Y_2O_3$), magnesium oxide (MgO), anodized $Al_2O_3$, sapphire, ceramics containing one or more of $Al_2O_3$, sapphire, aluminum nitride (AlN), yttrium oxide ($Y_2O_3$), magnesium oxide (MgO), or plastics. A representative example of a suitable silicon oxide ($SiO_2$) material is quartz. The radical conduit 108 may be disposed within and supported by a radical conduit support member 120. The radical conduit support member 120 may be disposed on the top plate 114, which rests on the lid rim 116.

In some embodiments, the radical cavity 110 is positioned below and coupled to the radical conduit 108, and the radicals generated in the remote plasma source 104 travel to the radical cavity 110 through the radical conduit 108. The radical cavity 110 is defined by the top plate 114, the lid rim 116 and the showerhead 118. Optionally, the radical cavity 110 may include a liner 122. The liner 122 may cover surfaces of the top plate 114 and the lid rim 116 that are exposed to the radical cavity 110. Radicals from the remote plasma source 104 pass through a plurality of tubes 124 disposed in the showerhead 118 to enter into an interior processing region 151. The showerhead 118 further includes a plurality of openings 126 that are smaller in diameter than the plurality of tubes 124. The plurality of openings 126 are connected to an internal volume (not shown) that is not in fluid communication with the plurality of tubes 124. One or more fluid sources 119 may be coupled to the showerhead 118 for introducing a fluid mixture into an interior processing region 151 of the processing chamber 100. The fluid mixture may include precursor, and/or carrier fluids. The fluid mixture may be a mixture of gases and liquids. In embodiments, non-limiting examples of suitable precursors include precursors suitable for forming silicon nitride ($SiN_x$) films such as trisilylamine (TSA).

The processing chamber 100 may include the lid assembly 112, a chamber body 130 and a substrate support assembly 132. The substrate support assembly 132 may be at least partially disposed within the chamber body 130. The chamber body 130 may include a slit valve 135 to provide access to the interior of the processing chamber 100. The chamber body 130 may include a liner 134 that covers the interior surfaces of the chamber body 130. The liner 134 may include one or more apertures 136 and a pumping channel 138 formed therein that is in fluid communication with a vacuum system 140. The apertures 136 provide a flow path for gases into the pumping channel 138, which provides an egress for the gases within the processing chamber 100.

The vacuum system 140 may include a vacuum port 142, a valve 144 and a vacuum pump 146. The vacuum pump 146 is in fluid communication with the pumping channel 138 via the vacuum port 142. The apertures 136 allow the pumping channel 138 to be in fluid communication with the interior processing region 151 within the chamber body 130. The interior processing region 151 is defined by a lower surface 148 of the showerhead 118 and an upper surface of the substrate support assembly 132, and the interior processing region is surrounded by the liner 134.

The substrate support assembly 132 may include a substrate support member 152 to support a substrate (not shown) for processing within the chamber body 130. The substrate may be any standard wafer size, such as, for example, 300 mm. Alternatively, the substrate may be larger than 300 mm, such as 450 mm or larger. The substrate support member 152 may include aluminum nitride (AlN) or aluminum, depending on operating temperature. The substrate support member 152 may be configured to chuck the substrate to the substrate support member 152. For example, the substrate support member 152 may be an electrostatic chuck or a vacuum chuck.

The substrate support member 152 may be coupled to a lift mechanism 154 through a shaft 156 which extends through a centrally-located opening 158 formed in a bottom surface of the chamber body 130. The lift mechanism 154 may be flexibly sealed to the chamber body 130 by bellows 160 that prevents vacuum leakage from around the shaft 156. The lift mechanism 154 allows the substrate support member 152 to be moved vertically within the chamber body 130 between a process position and a lower, transfer position. The transfer position is slightly below the opening of the slit valve 135. During operation, the spacing between the substrate 301 and the showerhead 118 may be minimized in order to maximize radical flux at the substrate surface. For example, the spacing may be between about 100 mm and about 5,000 mm. The lift mechanism 154 may be capable of rotating the shaft 156, which in turn rotates the substrate support member 152, causing the substrate disposed on the substrate support member 152 to be rotated during operation.

One or more heating elements 162 and a cooling channel 164 may be embedded in the substrate support member 152. The heating elements 162 and cooling channel 164 may be used to control the temperature of the substrate during operation. The heating elements 162 may be any suitable heating elements, such as one or more resistive heating elements. The heating elements 162 may be connected to one or more power sources (not shown). The heating elements 162 may be controlled individually to have independent heating and/or cooling control on multi-zone heating or cooling. With the ability to have independent control on multi-zone heating and cooling, the substrate temperature profile can be enhanced at any giving process conditions. A coolant may flow through the cooling channel 164 to cool the substrate. The substrate support member 152 may further include gas passages extending to the upper surface 150 for flowing a cooling gas to the backside of the substrate.

An RF source power 143 may be coupled to the showerhead 118 through an RF source power matching box 147. The RF source power 143 may be low frequency, high frequency, or very high frequency. In one embodiment, the RF source power 143 is a high frequency RF generator that may generate high density plasma for deposit high density film layers. In one example, the RF source power 143 may serve as an inductively coupled RF energy transmitting device that can generate and control the inductive coupled plasma (ICP) generated in the interior processing region 351 above the substrate support member 152. Dynamic impedance matching from the RF source power matching box 147 may be provided when generating the inductive coupled plasma (ICP).

In addition to the RF source power 143, a RF bias power source 145 may be coupled to the substrate support member 152. The substrate support member 152 is configured as a cathode and includes an electrode 163 that is coupled to the RF bias power source 145. The RF bias power source 145 is coupled between the electrode 163 disposed in the substrate support member 152 and another electrode, such as the showerhead 118 or ceiling (such as top plate 114) of the chamber body 130. The RF bias power generated from the RF bias power source 145 excites and sustains a plasma discharge formed from the gases disposed in the interior processing region 151 of the chamber body 130.

In one mode of operation, the substrate 301 is disposed on the substrate support member 152 in the processing chamber 100. A process gas and/or gas mixture is introduced into the chamber body 130 through the showerhead 118 from the gas sources 106. The vacuum pump 146 maintains the pressure inside the chamber body 130 while removing deposition byproducts.

A controller 170 is coupled to the processing chamber 100 to control operation of the processing chamber 100. The controller 170 includes a central processing unit (CPU) 172, a memory 174, and a support circuit 176 utilized to control the process sequence and regulate the gas flows from the gas sources 106. The CPU 172 may be any form of general purpose computer processor that may be used in an industrial setting. The software routines can be stored in the memory 174, such as random access memory, read only memory, floppy, or hard disk drive, or other form of digital storage. The support circuit 176 is conventionally coupled to the CPU 172 and may include cache, clock circuits, input/ output systems, power supplies, and the like. Bi-directional communications between the controller 170 and the various components of the processing chamber 100 are handled through numerous signal cables.

Figure 2:
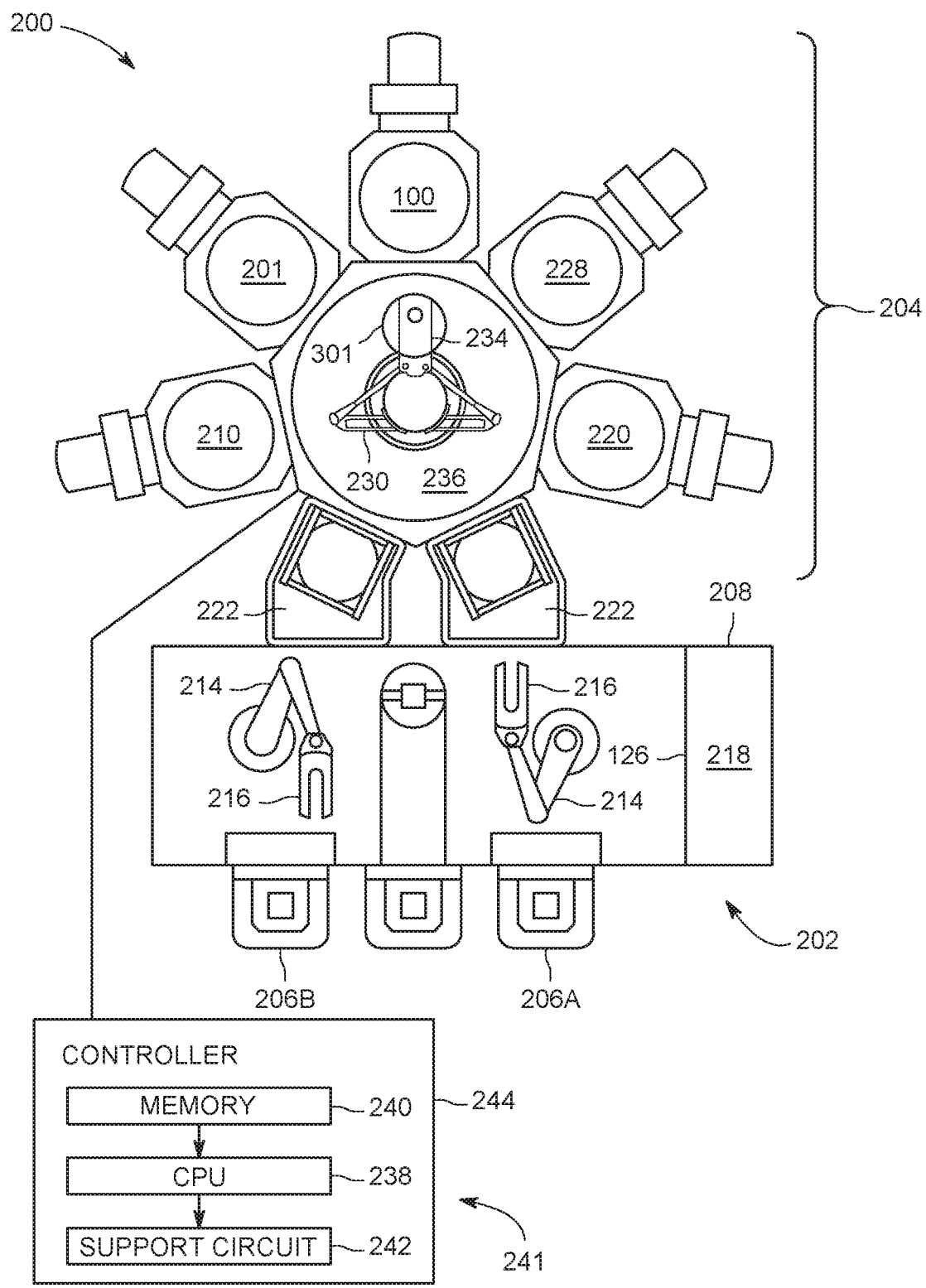
FIG. 2 depicts a top plan view of one embodiment of a processing tool including the apparatus of FIG. 1.

FIG. 2 is a schematic, top plan view of an exemplary processing system 200 that includes one or more of the processing chambers 100 illustrated in FIG. 1 that is incorporated and integrated therein. In one embodiment, the processing system 200 may be a CENTURA® integrated processing system, commercially available from Applied Materials, Inc., located in Santa Clara, California. However, other processing systems (including from other manufacturers) may also be adapted to benefit from the disclosure.

In some embodiments, the processing system 200 includes a vacuum-tight processing platform such as processing platform 204, a factory interface 202, and a system controller 244. The processing platform 204 includes at least one processing chamber 100, such as the one of the processing chambers 100 depicted from FIG. 1, a plurality of processing chambers 201, 228, 220, 210 and at least one load lock chamber 222 that is coupled to a vacuum substrate transfer chamber 236. Two load lock chambers 222 are shown in FIG. 2. The factory interface 202 is coupled to the transfer chamber 236 by the load lock chambers 222.

In one embodiment, the factory interface 202 includes at least one docking station such as docking station 208 and at least one factory interface robot 214 to facilitate transfer of substrates. The docking station 208 is configured to accept one or more front opening unified pod (FOUP). Two FOUPS 206A-B are shown in the embodiment of FIG. 2. The factory interface robot 214 having a blade 216 disposed on one end of the factory interface robot 214 is configured to transfer the substrate from the factory interface 202 to the processing platform 204 for processing through the load lock chambers 222. Optionally, one or more processing chambers 100, 201, 210, 220, 228 may be connected to a terminal 226 of the factory interface 202 to facilitate processing of the substrate from the FOUPS 206A-B.

Each of the load lock chambers 222 have a first port coupled to the factory interface 202 and a second port coupled to the transfer chamber 236. The load lock chambers 222 are coupled to a pressure control system (not shown) which pumps down and vents the load lock chambers 222 to facilitate passing the substrate between the vacuum environment of the transfer chamber 236 and the substantially ambient (e.g., atmospheric) environment of the factory interface 202.

The transfer chamber 236 has a vacuum robot 230 disposed therein. The vacuum robot 230 has a blade 234 capable of transferring substrates 301 among the load lock chambers 222, the processing chamber 100, processing chamber 201, and the processing chambers 201, 210, 220, 228.

In one embodiment of the processing system 200, the processing system 200 may include a processing chamber 100 depicted in FIG. 1 (such as a high density plasma (HDP) chamber) and other processing chambers 201, 210, 220, 228, which may be a deposition chamber, etch chamber, thermal processing chamber or other similar type of semiconductor processing chamber that may assist forming a dielectric material with good gap filling capability to be filled in a trench in semiconductor devices or provide for further downstream processing.

The system controller 244, much like the controller 170 described above, generally includes a central processing unit (CPU) 238, a memory 240, and support circuits 242. The CPU 238 may be one of any form of a general purpose computer processor that can be used in an industrial setting. The support circuits 242 are conventionally coupled to the CPU 238 and may include cache, clock circuits, input/output subsystems, power supplies, and the like. The software routines transform the CPU 238 into a specific purpose computer (controller) 244. The software routines may also be stored and/or executed by a second controller (not shown) that is located remotely from the processing system 200.

Figure 3:
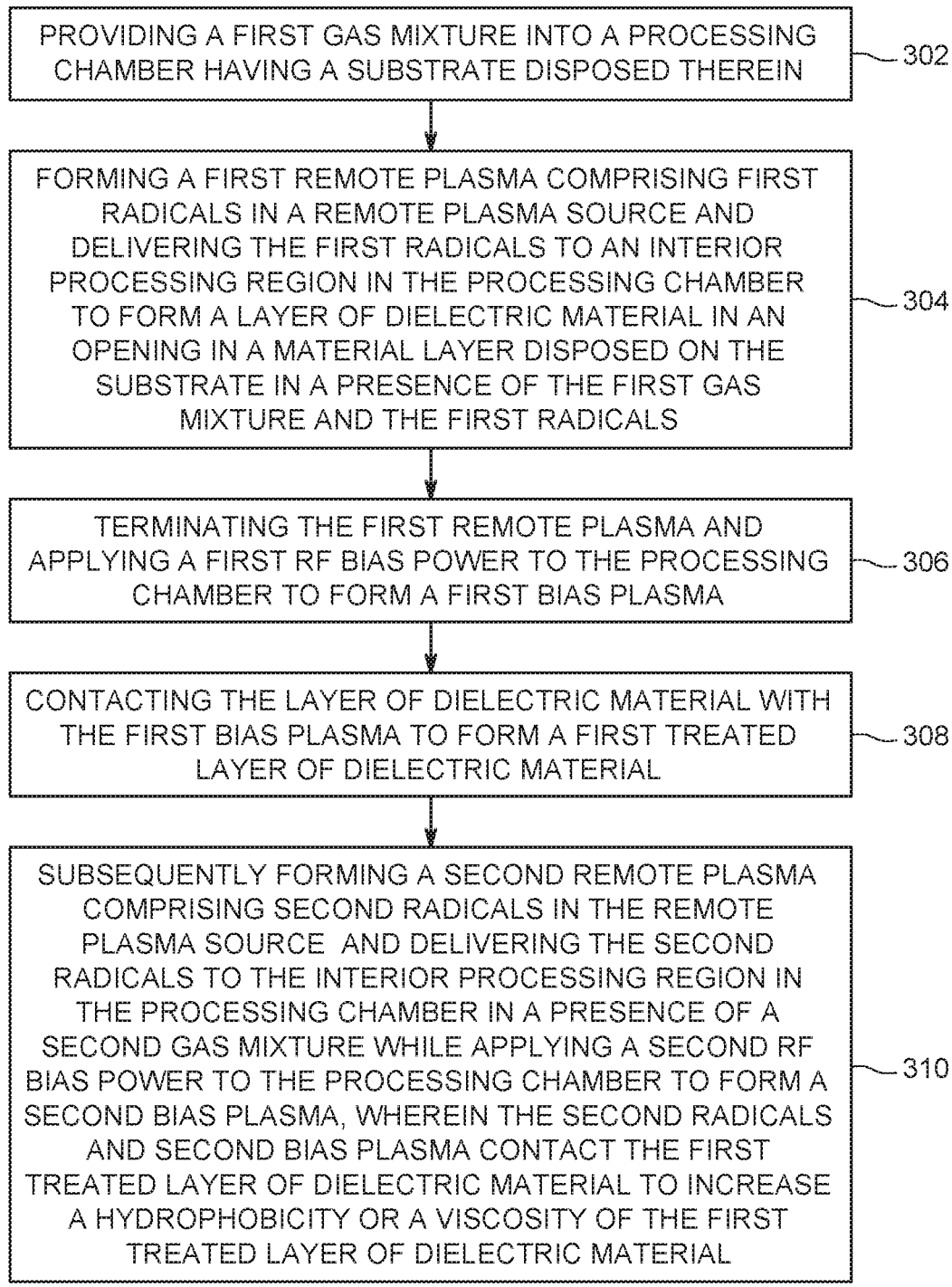
FIG. 3 is a process flow diagram illustrating a method for forming a dielectric material incorporating one embodiment of the disclosure.
Figure 4A:
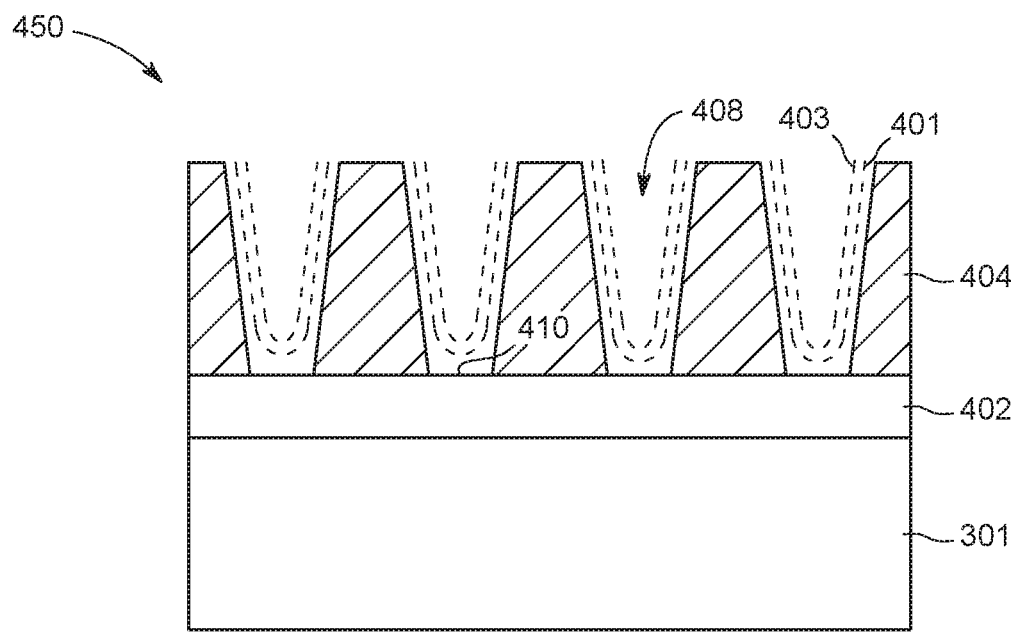
FIGS. 4A-4B depict the stages of filling a high aspect ratio opening in accordance with some embodiments of the present disclosure.
Figure 4B:
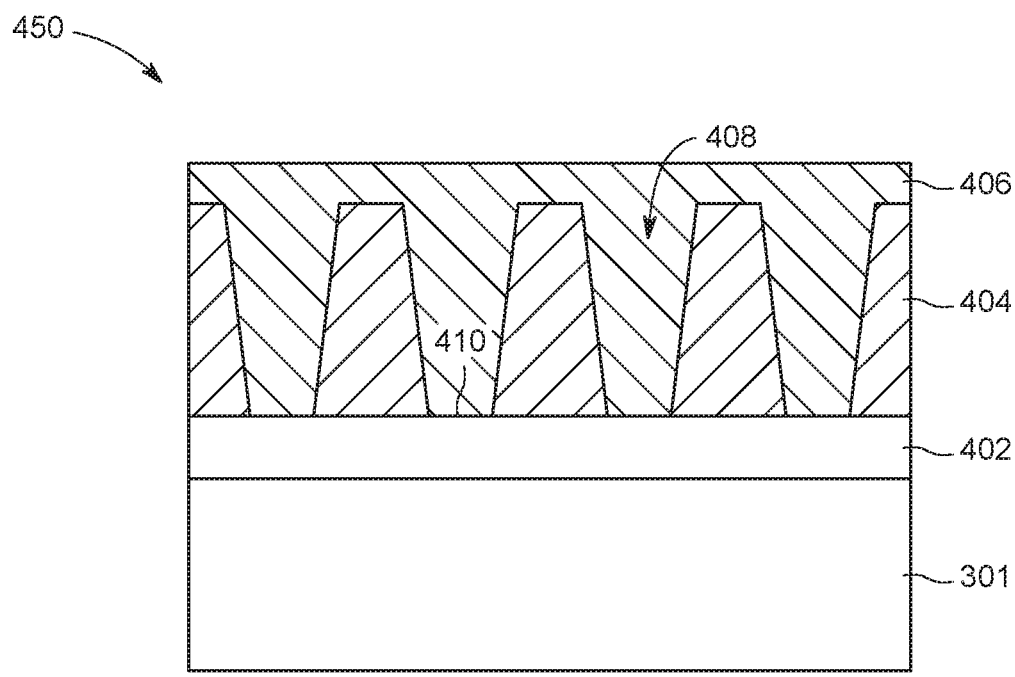

FIG. 3 is a flow diagram of one embodiment of a process 300 that may be practiced in the processing chamber 100 or other suitable processing chamber. FIGS. 4A-4B are schematic cross-sectional views of a portion of a composite substrate corresponding to various stages of the process 300. The process 300 may be utilized to fill features such as high aspect ratio features, e.g., greater than 3:1, or between 3:1 and 15:1 for structures, for semiconductor devices, particularly for three dimensional (3D) stacking of semiconductor memory. Alternatively, the process 300 may be beneficially utilized to fill other types of structures.

In some embodiments, the process 300 may begin by transferring or providing a substrate, such as the substrate 301 depicted in FIG. 4, to a deposition process chamber, such as the processing chamber 100 depicted in FIG. 1. The substrate 301 may have a substantially planar surface, an uneven surface, or a substantially planar surface having a structure formed thereon. In the embodiment depicted in FIG. 4A, the substrate 301 has a material layer 404 disposed on an interface layer 402. In one embodiment, the material layer 404 includes openings 408 formed therein. The material layer 404 may be utilized to form a gate structure, a contact structure, an interconnection structure in the front end or back end processes, or any suitable structures as needed. In one embodiment, the process 300 may be performed on the material layer 404 to form a contact structure therein. The substrate 301 may be a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, or sapphire. The substrate 301 may have various dimensions, such as 200 mm, 300 mm, 450 mm, or other diameter wafers, as well as, rectangular or square panels. Unless otherwise noted, embodiments and examples described herein are conducted on substrates with a 200 mm diameter, a 300 mm diameter, or a 450 mm diameter substrate. In the embodiment wherein a SOI structure is utilized for the substrate 301, the substrate 301 may include a buried dielectric layer disposed on a silicon crystalline substrate. In the embodiment depicted herein, the substrate 301 may be a crystalline silicon substrate.

In one embodiment, the interface layer 402 may be a dielectric layer. The material layer 404 has the openings 408 that expose portions 410 of the interface layer 402 for depositing a dielectric material therein. The openings 408 described herein may include trenches, vias, openings and the like. In one embodiment, the material layer 404 may be a metal containing material, silicon containing material, carbon containing materials, or other suitable materials. Suitable examples of the metal containing materials include copper containing material, aluminum containing materials, nickel containing material, tungsten containing material, or other metal containing materials. Suitable silicon containing materials include silicon, silicon oxide, silicon nitride, silicon oxynitride, and combinations thereof. Suitable carbon containing materials include silicon carbide, amorphous carbon, or the like. In an exemplary embodiment depicted herein, the material layer 404 such as a patterned material layer is a metal layer. In some embodiments, material layer 404 such as a patterned material layer may include one or more liner layers 401 or one or more barrier layers 403 deposited upon the top surface of material layer 404 such as a patterned material layer.

In some embodiments, the interface layer 402 may be a dielectric layer, such as a dielectric oxide layer, or dielectric nitride layer as needed. The interface layer 402 may include multiple layers, composite layers, or a single layer. Other suitable materials for the dielectric layer include undoped silicon glass (USG), such as silicon oxide or TEOS, boron-silicate glass (BSG), phosphorus-silicate glass (PSG), boron-phosphorus-silicate glass (BPSG), silicon nitride, amorphous silicon, and combinations thereof.

In some embodiments, the material layer 404 may be patterned to a predetermined depth to expose the portions 410 of the interface layer 402, as shown in FIG. 4A. The material layer 404 may be etched or patterned in any suitable patterning process. The material layer 404 may be patterned by supplying a gas mixture into the processing chamber along with a predetermined RF power level applied to the processing chamber.

At operation 302, a first gas mixture is provided into a processing chamber having a substrate disposed therein. For example, a first gas mixture such as a deposition gas mixture may be supplied to the processing chamber, such as the processing chamber 100 in FIG. 1, to perform a deposition process to form a dielectric material 406 (shown in FIG. 4B) in the openings 408. The first gas mixture supplied to the processing chamber 100 may be varied based on different types of materials to be formed and filled in the openings 408. In one example, when the dielectric material 406 to be formed is desired to be a silicon nitride layer, the first gas mixture as supplied may include one or more silicon containing gases, a nitrogen containing gas, and an inert gas such as argon. In another example, when the dielectric material 406 to be formed is desired to be a silicon oxide layer, the deposition gas mixture as supplied includes a silicon containing gas, an oxygen containing gas, and optionally an inert gas. In another example, when the dielectric material 406 to be formed is desired to be a silicon carbide layer, the deposition gas mixture as supplied may include a silicon containing gas, a carbon containing gas, and optionally an inert gas. In yet another example, when the dielectric material 406 to be formed is desired to be a carbide layer, the deposition gas mixture as supplied includes at least one carbon containing gas and optionally an inert gas.

Non-limiting examples of the silicon containing gas include silane ($SiH_4$), tetraethyl orthosilicate, disilane ($Si_2H_6$), and the like. Suitable examples of the nitrogen containing gas include nitrogen ($N_2$), ammonia ($NH_3$), dinitrogen monoxide ($N_2O$), nitrogen dioxide ($NO_2$), and the like. Suitable examples of the oxygen containing gas include hydrogen peroxide ($H_2O_2$), water ($H_2O$), oxygen ($O_2$), ozone ($O_3$), and the like. Suitable examples of the carbon containing gas include carbon dioxide ($CO_2$), hydrocarbon gases (such as $CH_4$ and $C_2H_6$), and the like. Suitable examples of the inert gas include helium (He), argon (Ar), and the like.

In some embodiments, additional carrier gases, such as nitrogen ($N_2$), hydrogen ($H_2$) and the like may also be supplied as needed in the deposition gas mixture.

In some embodiments, the first gas mixture includes silicon containing gas, nitrogen or carbon containing gas, and argon or hydrogen gas. In one specific example, the deposition gas mixture includes silane ($SiH_4$), argon (Ar), helium (He), ammonia ($NH_3$), hydrogen ($H_2$) and nitrogen ($N_2$), for depositing a silicon nitride layer as the dielectric material 406. In another specific example, the first gas mixture includes trisilylamine (TSA), argon (Ar), helium (He), and ammonia ($NH_3$) for depositing a silicon nitride layer as the dielectric material 406. In another specific example, the first gas mixture includes silane ($SiH_4$), argon (Ar), helium (He), methane ($CH_4$), carbon dioxide ($CO_2$), hydrogen ($H_2$) and/or nitrogen ($N_2$) for depositing a silicon carbide layer as the dielectric material 406. In yet another specific example, the first gas mixture includes ($SiH_4$), argon (Ar), helium (He), and oxygen ($O_2$) or nitrogen dioxide ($NO_2$), for depositing a silicon oxide layer as the dielectric material 406.

In some embodiments, a silicon containing gas is controlled at a flow rate between about 30 sccm and about 500 sccm by volume, or 50 sccm to 275 sccm by volume. The oxygen, carbon, or nitrogen containing gas is controlled at a flow rate between about 50 sccm and about 2000 sccm by volume. In some embodiments, argon (Ar), ammonia ($NH_3$), or helium (He) gas is controlled at a flow rate between about 500 sccm and about 3000 sccm by volume. In some embodiments, helium (He) gas is supplied at a flow rate of 1000 sccm by volume. In some embodiments, ammonia ($NH_3$) is supplied at a flow rate of 525 sccm by volume. In some embodiments, argon (Ar) is supplied at a flow rate of 2850 sccm by volume.

In some embodiments, some of the gases from the first gas mixture may be supplied from the gas source 106 through the remote plasma source 104 to the interior processing region 151 while some of the gases may be supplied through a side of the processing chamber 100, such as the fluid sources 119 that laterally formed around the showerhead 118, to be delivered to the interior processing region 151. In some examples, a first gas (e.g., the reactive precursors) from the first gas mixture, such as silicon containing gases such as TSA, are supplied from side (e.g., the fluid sources 119) of the processing chamber 100 while a second gas (e.g., the carrier gas, inert gas, carbon or nitrogen containing gases or other gases) from the first gas mixture are supplied from the gas source 106 through the remote plasma source 104 to the interior processing region 151. In some embodiments, the first gas is $SiH_4$ gas supplied from the fluid sources 119 into the processing chamber while the second gas is at least one of Ar, He, $NH_3$, $H_2$, $N_2$, or combinations thereof supplied from the gas source 106 through the remote plasma source 104 to the interior processing region 151. In some embodiments, the first gas is TSA gas supplied from the fluid sources 119 into the processing chamber while the second gas is at least one of Ar, He, $NH_3$, $H_2$, $N_2$, or combinations thereof supplied from the gas source 106 through the remote plasma source 104 to the interior processing region 151.

At operation 304, after the first gas mixture such as a deposition gas mixture is supplied to the processing chamber, a first remote plasma is formed including first radicals in the remote plasma source and delivering the first radicals to an interior processing region 151 in the processing chamber to form a layer of dielectric material in an opening in a material layer disposed on the substrate in a presence of the first gas mixture and the first radicals. In some embodiments, a first remote plasma source power is applied to the remote plasma source 104 to generate a first remote plasma to be delivered from the remote plasma source 104 to the interior processing region 151. In embodiments, remotely dissociated gas and/or other gases provide high density and low energy atomic species, as compared to conventional in-chamber RF source power applied to the showerhead, which may provide high energy but relatively low density gas radicals. In embodiments, by utilizing the remote plasma source with certain active gas species along with the gases supplied from the side, for example from the fluid sources 119, the high density gas species with relatively low energy atomic species, are then delivered to the interior processing region 151 to form the dielectric material 406 on the substrate 301, as shown in FIG. 4B. In embodiments, atomic gas species from the remote plasma source has higher degree of reactivity, which may react with reacting gas precursors supplied from the side, for example from the fluid sources 119, more efficiently, slowly and thoroughly, thus providing a good gap filling capability to fill the dielectric material 406 into the openings 408 defined in the material layer 404.

In some embodiments, the amount of each gas introduced into the processing chamber may be varied and adjusted to accommodate, for example, the thickness of the dielectric material 406 (for example, the height or geometry of the openings 408) to be formed in the openings 408. In one or more embodiments, the gases supplied from the remote plasma source 104 may have certain ratios. For example, a ratio of the nitrogen or carbon containing gas to the Ar gas may be controlled between about 0.2:1 and about 2:1 by volume.

In some embodiments, the radicals from the remote plasma are supplied to the substrate support member 152 for depositing dielectric material to a desired or predetermined thickness of the dielectric material 406 filled in the openings 408 in the material layer 404. For example, in embodiments, the dielectric material is deposited to a thickness of about 30 nanometers, 60 nanometers, 90 nanometers, or 120 nanometers, or between about 20 nanometers and 150 nanometers. As explained in below, the deposition may be cyclical such that layers of dielectric material are deposited in accordance with the present disclosure.

In some embodiments, a remote RF source power of between about 1000 watts and about 10000 watts, such as between about 2000 watts and about 4000 watts, is supplied to the remote plasma source 104 to generate remote plasma and radicals to be delivered to the interior processing region 151. The frequency at which the power to the remote plasma source 104 is applied around 400 kHz. The frequency can range from about 50 kHz to about 2.45 GHz. A substrate temperature is maintained between about −20 degrees Celsius to about 200 degrees Celsius, such as between about 20 degrees Celsius and about 90 degrees Celsius.

In some embodiments, at operation 306, while terminating the remote plasma from the remote plasma source 104 to the interior processing region 151, an RF bias power may be applied to the substrate support member 152 to generate a RF bias plasma to the substrate 301 disposed on the substrate support member 152. In some embodiments, the RF bias power generated to the substrate support member 152 is utilized to assist providing directionality to the plasma in the interior processing region 151 during the deposition process. In one embodiment, the RF bias power may be provided at 60 MHz and/or 2 MHz as needed. In one particular embodiment, the RF bias power is provided at 60 MHz, at 2 MHz or at 400 KHz.

In some embodiments, the RF bias power may be supplied to the substrate support member 152 in pulsed mode. In embodiments, the RF bias power supplied in a pulse mode can provide a relatively mild RF power level to the substrate 301 disposed on the substrate support assembly so that the reactive species can be accelerated toward the substrate 301 with a relatively mild energy level. The RF bias power supplied to the substrate support member 152 may be sequentially applied after the remote plasma power supplied from the remote plasma source 104.

In some embodiments, a remote plasma is supplied from the remote plasma source 104 from a first time point to a second time point. Subsequently, after the power applied to the remote plasma source 104 is terminated (e.g., the remote plasma supplied from the remote plasma source 104 is turned off) at the second time point, the RF bias power is then supplied to the substrate support member 152 in pulsed mode from the second time point to a third time point. The RF bias power supplied to the substrate support member 152 in pulsed mode may be terminated (for example, turned off) when a predetermined or desired thickness of the dielectric material 406 is filled in the openings 408 in the material layer 404. In some embodiments, the dielectric material 406 formed in the material layer 404 may be a silicon nitride material.

In some embodiments, the RF bias power supplied to the substrate support member 152 may form bias plasma for treating or densifying dielectric material to a desired or predetermined density in the openings 408 in the material layer 404. For example, at operation 308, the layer of dielectric material may be contacted with the first bias plasma to form a first treated layer of dialectic material. In embodiments, the dielectric material is treated to increase the density of the material.

In some embodiments, the RF bias power supplied to the substrate support member 152 may be accompanied by process gas mixtures as described herein. In some embodiments, the process gas mixtures are devoid of silicon containing gas. In some embodiments, oxygen, carbon, or nitrogen containing gas is controlled at a flow rate between about 50 sccm and about 2000 sccm by volume. In some embodiments, argon (Ar), ammonia ($NH_3$), or helium (He) gas is controlled at a flow rate between about 500 sccm and about 3000 sccm by volume. In some embodiments, helium (He) gas is supplied at a flow rate of 1000 sccm by volume. In some embodiments, ammonia ($NH_3$) is supplied at a flow rate of 525 sccm by volume. In some embodiments, argon (Ar) is supplied at a flow rate of 2850 sccm by volume.

In some embodiments, after application of a RF bias power, the inventors have observed the dielectric material 406 problematically may lose the ability to flow and/or maintain hydrophobic characteristics. For example, the viscosity of the dielectric material may increase such that the material loses the ability to flow. Moreover, the first treated dielectric material film may be problematically characterized as hydrophilic, or sufficiently hydrophillic to have a water contact angle below 85 degrees.

At process sequence 310, subsequent to contacting the layer of dielectric material with the first bias plasma to form a first treated layer of dielectric material, a second remote plasma may be formed including second radicals in the remote plasma source and include delivering the second radicals to the interior processing region in the processing chamber in a presence of a second gas mixture while applying a second RF bias power to the processing chamber to form a second bias plasma, wherein the second radicals and second bias plasma contact the first treated layer of dielectric material to increase a hydrophobicity or a viscosity of the first treated layer of dielectric material.

In some embodiments, at process sequence 310, a second remote plasma or radicals from the second remote plasma may be supplied from the remote plasma source 104 concurrently with the RF bias power supplied to the substrate support member 152 to the substrate 301 for a predetermined time period from a first time point to a second time point. In some embodiments, the remote plasma from the remote plasma source 104 is supplied in a continuous mode, and the RF bias power supplied to the substrate support member 152 is in a continuous mode. In some embodiments, the second remote plasma from the remote plasma source 104 and the RF bias power supplied to the substrate support member 152 may be terminated concurrently at a second time point when a desired viscosity and/or hydrophobicity of the dielectric material 406 is obtained such as in the openings 408 in the material layer 404. In some embodiments, the dielectric material 406 formed in the material layer 404 may be a silicon nitride material.

At process sequence 310, in some embodiments, a second gas mixture supplied to the processing chamber 100 may be varied based on different types of materials of the first treated layer of dielectric material in the openings 408. In one example, when the dielectric material 406 is a silicon nitride layer, the second gas mixture supplied includes at least one silicon containing gas, nitrogen containing gas, or optionally an inert gas. In another example, when the first treated layer of dielectric material is a silicon oxide layer, the second gas mixture may include at least one silicon containing gas, oxygen containing gas, or optionally an inert gas. In another example, when the first treated layer of dielectric material is a silicon carbide layer, the second gas mixture as supplied includes at least one silicon containing gas, carbon containing gas, or optionally an inert gas. In yet another example, when the first treated layer of dielectric material is a carbide layer, the second gas mixture may include at least one carbon containing gas, or optionally an inert gas.

Non-limiting examples of the silicon containing gas include silane ($SiH_4$), tetraethyl orthosilicate, disilane ($Si_2H_6$), and the like. Suitable examples of the nitrogen containing gas include nitrogen ($N_2$), ammonia ($NH_3$), dinitrogen monoxide ($N_2O$), nitrogen dioxide ($NO_2$), and the like. Suitable examples of the oxygen containing gas include hydrogen peroxide ($H_2O_2$), water ($H_2O$), oxygen ($O_2$), ozone ($O_3$), and the like. Suitable examples of the carbon containing gas include carbon dioxide ($CO_2$), hydrocarbon gases (such as $CH_4$ and $C_2H_6$), and the like. Suitable examples of the inert gas include helium (He), argon (Ar) and the like. In some embodiments, carrier gases, such as nitrogen ($N_2$), hydrogen ($H_2$) and the like may also be supplied as needed in the second gas mixture.

In some embodiments, the second gas mixture includes silicon containing gas, nitrogen or carbon containing gas, and argon or hydrogen gas. In one specific example, the second gas mixture includes silane ($SiH_4$), argon (Ar) or helium (He), ammonia ($NH_3$), hydrogen ($H_2$) or nitrogen ($N_2$), or combinations thereof for a silicon nitride layer as the first treated layer of dielectric material. In another specific example, the second gas mixture includes trisilylamine (TSA), argon (Ar), helium (He), or ammonia ($NH_3$), or combinations thereof for a silicon nitride layer as the first treated layer of dielectric material. In another specific example, the deposition gas mixture includes silane ($SiH_4$), argon (Ar), helium (He), methane ($CH_4$), carbon dioxide ($CO_2$), hydrogen ($H_2$) or nitrogen ($N_2$) for a silicon carbide layer as the first treated layer of dielectric material. In yet another specific example, the second gas mixture includes ($SiH_4$), argon (Ar), helium (He), or oxygen ($O_2$) or nitrogen dioxide ($NO_2$), for a silicon oxide layer as the first treated layer of dielectric material.

In some embodiments, a silicon containing gas is controlled at a flow rate between about 30 sccm and about 500 sccm by volume, or 50 sccm to 275 sccm by volume. The oxygen, carbon, or nitrogen containing gas is controlled at a flow rate between about 50 sccm and about 2000 sccm by volume. In some embodiments, argon (Ar), ammonia ($NH_3$), or helium (He) gas is controlled at a flow rate between about 500 sccm and about 3000 sccm by volume. In some embodiments, helium (He) gas is supplied at a flow rate of 1000 sccm by volume. In some embodiments, ammonia ($NH_3$) is supplied at a flow rate of 525 sccm by volume. In some embodiments, argon (Ar) is supplied at a flow rate of 2850 sccm by volume.

In some embodiments, some of the gases from the second gas mixture may be supplied from the gas source 106 through the remote plasma source 104 to the interior processing region 151 while some of the gases may be supplied through a side of the processing chamber 100, such as the fluid sources 119 that laterally formed around the showerhead 118, to be delivered to the interior processing region 151. In some examples, a first gas is the same as the first gas described above (e.g., the reactive precursors), such as silicon containing gases such as TSA, are supplied from side (e.g., the fluid sources 119) of the processing chamber 100 while a second gas (e.g., the carrier gas, inert gas, carbon or nitrogen containing gases or other gases) are supplied from the gas source 106 through the remote plasma source 104 to the interior processing region 151. In some embodiments, the first gas is $SiH_4$ gas supplied from the fluid sources 119 into the processing chamber while the second gas is at least one of Ar, He, $NH_3$, $H_2$, $N_2$, or combinations thereof supplied from the gas source 106 through the remote plasma source 104 to the interior processing region 151. In some embodiments, the first gas is TSA gas supplied from the fluid sources 119 into the processing chamber while the second gas is at least one of Ar, He, $NH_3$, $H_2$, $N_2$, or combinations thereof supplied from the gas source 106 through the remote plasma source 104 to the interior processing region 151.

At process sequence 310, while the second gas mixture is supplied to the processing chamber, a second remote plasma is formed including second radicals in the remote plasma source. In embodiments, second radicals are suitable for delivery into an interior processing region 151 in the processing chamber in a presence of the second gas mixture and the second radicals. In some embodiments, a second remote plasma source power is applied to the remote plasma source 104 to generate a second remote plasma to be delivered from the remote plasma source 104 to the interior processing region 151. In embodiments, remotely dissociated gas and/or other gases provide high density and low energy atomic species, as compared to conventional in-chamber RF source power applied to the showerhead, which may provide high energy but relatively low density gas radicals. In embodiments, by utilizing the remote plasma source with certain active gas species along with the gases supplied from the side, for example from the fluid sources 119, the high density gas species with relatively low energy atomic species, are then delivered to the interior processing region 151 to form the dielectric material 406 on the substrate 301, as shown in FIG. 4B. In embodiments, atomic gas species from the remote plasma source has higher degree of reactivity, which may react with reacting gas precursors supplied from the side, for example from the fluid sources 119, more efficiently, slowly and thoroughly, thus providing a good gap filling capability to fill the dielectric material 406 into the openings 408 defined in the material layer 404.

In some embodiments, the amount of each gas introduced into the processing chamber may be varied and adjusted to accommodate, for example, the viscosity and hydrophobicity of the first treated layer of dielectric material.

In some embodiments, a remote RF source power of between about 1000 watts and about 10000 watts, such as between about 2000 watts and about 4000 watts, is supplied to the remote plasma source 104 to generate a second remote plasma to be delivered to the interior processing region 151. The frequency at which the power to the second remote plasma source may be the same as remote plasma source 104 and applied around 400 kHz. The frequency can range from about 50 kHz to about 2.45 GHz. A substrate temperature is maintained between about −20 degrees Celsius to about 200 degrees Celsius, such as between about 20 degrees Celsius and about 90 degrees Celsius.

In some embodiments, at process sequence 310, while maintaining the second remote plasma from the remote plasma source 104 to the interior processing region 151, a second RF bias power may be simultaneously applied to the substrate support member 152 to generate a second RF bias plasma to the substrate 301 disposed on the substrate support member 152. In some embodiments, the second RF bias power may be provided at 60 MHz and/or 2 MHz as needed. In one particular embodiment, the second RF bias power is provided at 60 MHz, at 2 MHz or at 400 KHz.

In some embodiments, a second remote plasma is supplied from the remote plasma source 104 and the second RF bias power is supplied to the substrate support member 152 for a predetermined time such as 10 to 30 seconds. In some embodiments, the first treated layer of dielectric material may be a silicon nitride material.

In some embodiments, the second RF bias power supplied to the substrate support member 152 may form second bias plasma for treating the first treated layer of dielectric material to a desired or predetermined viscosity or hydrophobicity in the openings 408 in the material layer 404. For example, subsequent to process sequence 310, the first treated layer of dielectric material may be characterized as hydrophobic, or sufficiently hydrophobic to have a water contact angle of approximately 90 to approximately 110 degrees. Hydrophobic and hydrophobicity refer to the wettability of a surface (e.g., a coating surface or smooth surface) that has a water contact angle of approximately 85° or more. Typically, on a hydrophobic surface, for example, a 2-mm-diameter water drop beads up but does not run off the surface when the surface is tilted moderately. As the surface is tilted, the wetting angle at the downhill side of the droplet increases, while the wetting angle at the uphill side of the droplet decreases. Due to difficulty for the advancing (downhill) interface to push forward onto the next increment of solid surface and the difficulty for the receding (uphill) interface to let go of the portion of solid surface upon which the droplet is disposed, the droplet tends to remain stationary or pinned in place. In embodiments the contact angle is measured by methods know in the art such as using a goniometer.

In embodiments, the first treated layer of dielectric material or the top surface thereof is treated to increase the contact angle thereof by at least 10 degrees, at least 20 degrees, at least 30 degrees, at least 50 degrees, when contacted with water. In embodiments, the first treated layer of dielectric material is altered to have a contact angle in an amount of 90 to 110 degrees when contacted with water. In embodiments, subsequent to process sequence 310, the first treated layer of dielectric material includes a contact angle of at least 100 degrees, at least 102 degrees, at least 104 degrees, at least 106 degrees, at least 108 degrees, or at least 110 degrees, when contacted with water.

In some embodiments, the present disclosure relates to a method of depositing a dielectric material. In embodiments, the method includes: (a) providing a first gas mixture into a processing chamber having a substrate disposed therein; (b) forming a first remote plasma including first radicals in a remote plasma source and delivering the first radicals to an interior processing region in the processing chamber to form a layer of dielectric material in an opening in a material layer disposed on the substrate in a presence of the first gas mixture and the first radicals; (c) terminating the first remote plasma and applying a first RF bias power to the processing chamber to form a first bias plasma; (d) contacting the layer of dielectric material with the first bias plasma to form a first treated layer of dielectric material; and (e) subsequently forming a second remote plasma including second radicals in the remote plasma source and delivering the second radicals to the interior processing region in the processing chamber in a presence of a second gas mixture while applying a second RF bias power to the processing chamber to form a second bias plasma, wherein the second radicals and second bias plasma contact the first treated layer of dielectric material to increase a hydrophobicity or a viscosity of the first treated layer of dielectric material. In some embodiments, the methods include repeating (a) through (e) until the first treated layer of dielectric material has a predetermined thickness such as for example 90 to 160 nanometers. In some embodiments the method includes contacting the layer of dielectric material with the first bias plasma to form a first treated layer of dielectric material lowers a hydrophobicity of the first treated layer of dielectric material, wherein the first treated layer of dielectric material has a contact angle below 90 degrees when contacted with water. In some embodiments, contacting the second radicals and second bias plasma with the first treated layer of dielectric material increases a hydrophobicity of the first treated layer of dielectric material, wherein the hydrophobicity of a first surface of the first treated layer of dielectric material has a contact angle in an amount of 90 to 110 degrees when contacted with water. In some embodiments, a first gas mixture and a second gas mixture includes silicon-containing gas, argon, helium, and ammonia at a temperature of minus 20 degrees Celsius to 90 degrees Celsius. In some embodiments, (e) includes contacting the first treated layer of dielectric material with the second radicals and second RF bias plasma for about 5 seconds. In some embodiments, the second gas mixture includes argon, helium, ammonia, and trisilylamine (TSA) at a temperature of minus 20 degrees Celsius to 90 degrees Celsius. In some embodiments, the second remote plasma is formed prior to applying a second RF bias power to the processing chamber. In some embodiments, forming the first remote plasma further includes: forming the first remote plasma for a predetermined period of time; and terminating the first remote plasma prior to applying a first RF bias power. In some embodiments, the first gas mixture and second gas mixture include a precursor gas supplied through a side of the processing chamber to the interior processing region. In some embodiments, the first gas mixture and second gas mixture include a second gas supplied through the remote plasma source to the interior processing region. In some embodiments, the first gas mixture and second gas mixture include one or more gases is selected from a group consisting of silicon containing gas, nitrogen containing gas, inert gas, carbon containing gas, and oxygen containing gas. In some embodiments, the first gas mixture and second gas mixture includes at least argon (Ar), helium (He), ammonia ($NH_3$), hydrogen ($H_2$), and nitrogen ($N_2$). In some embodiments, the first treated layer of dielectric material is a silicon nitride layer, or silicon carbide layer. In some embodiments, the method includes maintaining a substrate temperature between about −20 degrees Celsius to about 90 degrees Celsius.

Referring now to FIG. 5, a method 500 includes a method for forming a dielectric material in accordance with the present disclosure. In embodiments, method 500 includes at process sequence 502 filling an opening having an aspect ratio greater 5 on a substrate with a dielectric material formed from sequentially applying a first remote plasma, a first bias plasma, and a second remote plasma in combination with a second bias plasma to an interior processing region of a processing chamber where the substrate is disposed. At process sequence 504, method 500 includes increasing at least a flowability or a hydrophobicity of the dielectric material. In some embodiments, the method includes a dielectric material, wherein the dielectric material is a silicon nitride layer, or silicon carbide layer. In embodiments, the opening is filled with dielectric material from a bottom to a top. In some embodiments, the opening is filled with a plurality of layers of dielectric material to a predetermined thickness.

In some embodiments, the present disclosure relates to a process chamber and/or integrated system configured for (a) providing a first gas mixture into a processing chamber having a substrate disposed therein; (b) forming a first remote plasma comprising first radicals in a remote plasma source and delivering the first radicals to an interior processing region in the processing chamber to form a layer of dielectric material in an opening in a material layer disposed on the substrate in a presence of the first gas mixture and the first radicals; (c) terminating the first remote plasma and applying a first RF bias power to the processing chamber to form a first bias plasma; (d) contacting the layer of dielectric material with the first bias plasma to form a first treated layer of dielectric material; and (e) subsequently forming a second remote plasma comprising second radicals in the remote plasma source and delivering the second radicals to the interior processing region in the processing chamber in a presence of a second gas mixture while applying a second RF bias power to the processing chamber to form a second bias plasma, wherein the second radicals and second bias plasma contact the first treated layer of dielectric material to increase a hydrophobicity or a viscosity of the first treated layer of dielectric material.

In some embodiments, the present disclosure relates to a non-transitory computer readable storage medium having stored instructions thereon that, when executed by a processor, cause a method to be performed, the method comprising: (a) providing a first gas mixture into a processing chamber having a substrate disposed therein; (b) forming a first remote plasma comprising first radicals in a remote plasma source and delivering the first radicals to an interior processing region in the processing chamber to form a layer of dielectric material in an opening in a material layer disposed on the substrate in a presence of the first gas mixture and the first radicals; (c) terminating the first remote plasma and applying a first RF bias power to the processing chamber to form a first bias plasma; (d) contacting the layer of dielectric material with the first bias plasma to form a first treated layer of dielectric material; and (e) subsequently forming a second remote plasma comprising second radicals in the remote plasma source and delivering the second radicals to the interior processing region in the processing chamber in a presence of a second gas mixture while applying a second RF bias power to the processing chamber to form a second bias plasma, wherein the second radicals and second bias plasma contact the first treated layer of dielectric material to increase a hydrophobicity or a viscosity of the first treated layer of dielectric material.

While the foregoing is directed to embodiments of the present disclosure, other and further embodiments of the disclosure may be devised without departing from the basic scope thereof.

The invention claimed is:

1. A method of depositing a dielectric material, comprising:
a bottom-up gap fill process on a barrier layer including:
(a) providing a first gas mixture into a processing chamber having a substrate disposed therein, wherein the first gas mixture has at least one gas provided by a fluid source connected to an interior processing region of the processing chamber via a direct connection with a showerhead and wherein the interior processing region comprises a volume in direct contact with a substrate when present;
(b) during a first duration, forming a first remote plasma in a continuous power mode comprising first radicals formed in a remote plasma source and delivering the first radicals to the interior processing region in the processing chamber to form a layer of dielectric material with a dielectric constant and a first density in an opening in a material layer disposed on the substrate in a presence of the first gas mixture and the first radicals, wherein a first RF bias power is not supplying power during the first duration;
(c) terminating the first remote plasma and applying the first RF bias power to the processing chamber to form a first bias plasma for a second duration, wherein the first RF bias power is pulsed while the layer of dielectric material continues to be deposited until a desired thickness is obtained which ends the second duration;
(d) densifying the layer of dielectric material to a second density greater than the first density with the first bias plasma during a third duration after the second duration has ended by applying the first RF bias power in a continuous power mode to perform a single, continuous first treatment to form a first treated layer of dielectric material with an increased density of dielectric material, wherein a process gas mixture devoid of silicon is supplied to the interior processing region during the first bias plasma in the continuous power mode and wherein a completion of the single, continuous first treatment ends the third duration; and
(e) during a fourth duration, after the third duration has ended, subsequently forming a second remote plasma in a continuous power mode comprising second radicals in the remote plasma source and delivering the second radicals to the interior processing region in the processing chamber in a presence of a second gas mixture while concurrently applying a second RF bias power in a continuous power mode during the fourth duration to the processing chamber to form a second bias plasma in a single, continuous second treatment that is different from the single, continuous first treatment, wherein the second radicals and second bias plasma contact the first treated layer of dielectric material to increase a hydrophobicity of the first treated layer of dielectric material by a water contact angle of at least 10 degrees, wherein the second remote plasma is continuously generated by an RF power supply in a continuous power mode for an entire duration of the fourth duration of the single, continuous second treatment and the second RF bias power operates in a continuous power mode to continuously generate the second bias plasma for the entire duration of the fourth duration of the single, continuous second treatment and wherein the dielectric constant of the layer of dielectric material is maintained after the single, continuous second treatment.

2. The method of claim 1, further comprising: repeating (a) through (e) until the first treated layer of dielectric material has a predetermined thickness.

3. The method of claim 1, wherein contacting the layer of dielectric material with the first bias plasma to form a first treated layer of dielectric material lowers a hydrophobicity of the first treated layer of dielectric material, wherein the first treated layer of dielectric material has a contact angle below 90 degrees when contacted with water.

4. The method of claim 1, wherein contacting the second radicals and second bias plasma with the first treated layer of dielectric material increases a hydrophobicity of the first treated layer of dielectric material, wherein the hydrophobicity of a first surface of the first treated layer of dielectric material has a contact angle in an amount of 90 to 110 degrees when contacted with water.

5. The method of claim 1, wherein the first gas mixture and the second gas mixture comprises silicon-containing gas, argon, helium, and ammonia at a temperature of minus 20 degrees Celsius to 90 degrees Celsius, wherein the silicon-containing gas has a flow rate of approximately 30 sccm to approximately 500 sccm.

6. The method of claim 1, wherein (e) comprises contacting the first treated layer of dielectric material with the second radicals and second RF bias plasma for about 5 seconds.

7. The method of claim 1, wherein the second gas mixture comprises argon, helium, ammonia, and trisilylamine (TSA) at a temperature of minus 20 degrees Celsius to 90 degrees Celsius.

8. The method of claim 1, wherein the second remote plasma is formed prior to applying a second RF bias power to the processing chamber.

9. The method of claim 1, wherein forming the first remote plasma further comprises: forming the first remote plasma for a predetermined period of time and terminating the first remote plasma prior to applying a first RF bias power.

10. The method of claim 1, wherein the first gas mixture and second gas mixture comprises a precursor gas supplied through a side of the processing chamber to the interior processing region.

11. The method of claim 1, wherein the first gas mixture and second gas mixture comprises a second gas supplied through the remote plasma source to the interior processing region.

12. The method of claim 1, wherein the first gas mixture and second gas mixture comprises one or more gases is selected from a group consisting of silicon containing gas, nitrogen containing gas, inert gas, carbon containing gas, and oxygen containing gas.

13. The method of claim 1, wherein the first gas mixture and second gas mixture comprises at least argon (Ar), helium (He), ammonia ($NH_3$), hydrogen ($H_2$), and nitrogen ($N_2$).

14. The method of claim 1, wherein the first treated layer of dielectric material is a silicon nitride layer or silicon carbide layer.

15. The method of claim 1, further comprising:
maintaining a substrate temperature between about −20 degrees Celsius to about 90 degrees Celsius.

16. A method for forming a dielectric material, comprising:
filling, from a bottom upwards, an opening having an aspect ratio greater than 5 on a substrate with a dielectric material with a first density formed from sequentially applying a first remote plasma in a continuous power mode to deposit the dielectric material in the opening during a first duration, a first bias plasma in a continuous power mode to increase a density of the dielectric material to a second density greater than the first density in the opening during a single, continuous first treatment during a second duration, and a second remote plasma in combination with a second bias plasma to an interior processing region of a processing chamber where the substrate is disposed in a single, continuous second treatment that is different from the single, continuous first treatment for a third duration, wherein the second remote plasma and the second bias plasma are continuously generated by continuous RF power that operates in a continuous power mode for an entire duration of the third duration of the single, continuous second treatment; and
increasing a hydrophobicity of the dielectric material by a water contact angle of at least 10 degrees after the single, continuous second treatment is performed, wherein a dielectric constant of the dielectric material is maintained after the single, continuous second treatment.

17. The method of claim 16, wherein the dielectric material is a silicon nitride layer, or silicon carbide layer.

18. The method of claim 16, wherein the opening is filled with dielectric material from a bottom to a top.

19. The method of claim 16, wherein the opening is filled with a plurality of layers of dielectric material to a predetermined thickness.

20. A non-transitory computer readable storage medium having stored instructions thereon that, when executed by a processor, cause a method to be performed, the method comprising:
a bottom-up gap fill process on a barrier layer including:
(a) providing a first gas mixture into a processing chamber having a substrate disposed therein, wherein the first gas mixture has at least one gas provided by a fluid source connected to an interior processing region of the processing chamber via a direct connection with a showerhead and wherein the interior processing region comprises a volume in direct contact with a substrate when present;
(b) during a first duration, forming a first remote plasma in a continuous power mode comprising first radicals formed in a remote plasma source and delivering the first radicals to the interior processing region in the processing chamber to form a layer of dielectric material with a dielectric constant and a first density in an opening in a material layer disposed on the substrate in a presence of the first gas mixture and the first radicals, wherein a first RF bias power is not supplying power during the first duration;
(c) terminating the first remote plasma and applying the first RF bias power to the processing chamber to form a first bias plasma for a second duration, wherein the first RF bias power is pulsed while the layer of dielectric material continues to be deposited until a desired thickness is obtained which ends the second duration;

(d) densifying the layer of dielectric material to a second density greater than the first density with the first bias plasma during a third duration after the second duration has ended by applying the first RF bias power in a continuous power mode to perform a single, continuous first treatment to form a first treated layer of dielectric material with an increased density of dielectric material, wherein a process gas mixture devoid of silicon is supplied to the interior processing region during the first bias plasma in the continuous power mode and wherein a completion of the single, continuous first treatment ends the third duration; and (e) during a fourth duration, after the third duration has ended, subsequently forming a second remote plasma in a continuous power mode comprising second radicals in the remote plasma source and delivering the second radicals to the interior processing region in the processing chamber in a presence of a second gas mixture while concurrently applying a second RF bias power in a continuous power mode during the fourth duration to the processing chamber to form a second bias plasma in a single, continuous second treatment that is different from the single, continuous first treatment, wherein the second radicals and second bias plasma contact the first treated layer of dielectric material to increase a hydrophobicity of the first treated layer of dielectric material by a water contact angle of at least 10 degrees, wherein the second remote plasma is continuously generated by an RF power supply in a continuous power mode for an entire duration of the fourth duration of the single, continuous second treatment and the second RF bias power operates in a continuous power mode to continuously generate the second bias plasma for the entire duration of the fourth duration of the single, continuous second treatment and wherein the dielectric constant of the layer of dielectric material is maintained after the single, continuous second treatment.

* * * * *